United States Patent [19]

Darcie

[11] Patent Number: 4,794,351

[45] Date of Patent: Dec. 27, 1988

[54] OPTICAL MIXER FOR UPCONVERTING OR DOWNCONVERTING AN OPTICAL SIGNAL

[75] Inventor: Thomas E. Darcie, Hazlet, N.J.

[73] Assignee: American Telephone and Telegraph Company, AT&T Bell Laboratories, Murray Hill, N.J.

[21] Appl. No.: 912,802

[22] Filed: Sep. 29, 1986

[51] Int. Cl.$^4$ .................. H01S 3/10; G02F 1/36; H04B 9/00

[52] U.S. Cl. .................. 332/7.51; 330/4.3; 370/4; 455/617

[58] Field of Search .................. 332/7.51; 330/4.3; 370/1, 3, 4; 455/610, 611, 617–619; 307/425

[56] References Cited

U.S. PATENT DOCUMENTS

| | | | |
|---|---|---|---|
| 3,295,911 | 1/1967 | Ashkin et al. | 332/7.51 |
| 3,301,625 | 1/1967 | Ashkin et al. | 332/7.51 |
| 3,309,526 | 3/1967 | Giordmaine | 307/425 |
| 3,724,926 | 4/1973 | Lee | 332/7.51 |
| 3,806,834 | 4/1974 | Johnston et al. | 332/7.51 |
| 3,842,372 | 10/1974 | Pao et al. | 332/7.51 |
| 3,860,880 | 1/1975 | Yariv et al. | 330/5 |
| 4,012,113 | 3/1977 | Kogelnik et al. | 350/96 |
| 4,317,236 | 2/1982 | Bosch et al. | 455/611 |
| 4,349,907 | 9/1982 | Campillo et al. | 372/92 |
| 4,468,766 | 8/1984 | Spezio | 455/619 |
| 4,503,403 | 3/1985 | Taylor et al. | 455/619 |
| 4,507,775 | 3/1985 | Sheem | 370/4 |
| 4,545,075 | 10/1985 | Muller et al. | 455/612 |
| 4,546,476 | 11/1985 | Shaw et al. | 372/6 |
| 4,554,510 | 11/1985 | Shaw et al. | 330/4.3 |
| 4,706,300 | 11/1987 | Minemura et al. | 455/619 |
| 4,723,317 | 2/1988 | Glance | 455/619 |
| 4,723,616 | 2/1988 | Glance | 455/619 |
| 4,754,452 | 6/1988 | Henry | 370/85 |

FOREIGN PATENT DOCUMENTS

| | | | |
|---|---|---|---|
| 0145972 | 6/1985 | European Pat. Off. | 455/611 |
| 2168561 | 6/1986 | United Kingdom | 455/611 |

OTHER PUBLICATIONS

Darcie et al., "Lightwave System . . . Multiplexing," 6/17/86, Elect. Lett., vol. 22, No. 15, pp. 774–775.
Donald et al., "Efficient Simple . . . " 80 GH3, 4/10/85, 545 SPIE 29–34, Conf. Arlington, Va.; Abst. only.
Rauscher et al., "Self-oscillating . . . Optical Signals", 6/4/86, 848 IEEE 721-4, Balt., Md. Conf.; Abst. only.
Nazarenko et al., Sov. J. Quantum Electron., vol. 7, No. 8, Aug. 1977, pp. 984–989.
Minakata et al., Trans. IECE of Japan, vol. E61, No. 3, Mar. 78, pp. 148–151.
Foyt et al., Proc. SPIE, vol. 269, Feb. 1981, Los Angeles, Calif., pp. 109–114.
Wong et al. Optics Letters, vol. 7, No. 11, Nov. 1982, pp. 546–548.
Annenkov et al., Sov. J. Quantum Electron., vol. 14, No. 2, Feb. 1984, pp. 163–164.
Goldobin et al., Sov. J. Quantum Electron., vol. 14, No. 2, Feb. 1984, pp. 255–259.
Lam, IEEE Electron Device Letters, vol. EDL-5, No. 1, Jan. 1984, pp. 1–3.
MacDonald et al., IEEE Jnl. Solid-State Ckts., vol. SC-19 No. 2, Apr. 1984, pp. 219–222.
Hegarty et al., Appl. Phys. Lett., vol. 45, No. 12, Dec. 1984 pp. 1314–1316.
Lam et al., IEEE Trans. Electron Dev., vol. ED-31, No. 12, Dec. 1984, pp. 1766–1768.

*Primary Examiner*—Nelson Moskowitz
*Attorney, Agent, or Firm*—Erwin W. Pfeifle

[57] ABSTRACT

The present invention relates to an optical upconverting or downconverting gain or loss modulating mixer and a receiver for subcarrier optical communication systems using this mixer. The optical mixer can be formed, for example, from an optical amplifier including a semiconductor laser chip comprising a p-n junction with an active region channel formed along the junction. An optical signal received from the communication system is directed into one end of the channel, and a combination of a D-C bias signal and a local oscillator signal is concurrently impressed on the chip to gain-modulate the received optical signal and produce an upconverted or downconverted output signal. In the receiver, the upconverted or downconverted output signal from the gain-modulated optical amplifier is detected by a photodetector, amplified if necessary, filtered and then demodulated before transmission to the output utilization device. A loss modulator provides similar optical mixing but does not provide a gain to the output signal.

8 Claims, 4 Drawing Sheets

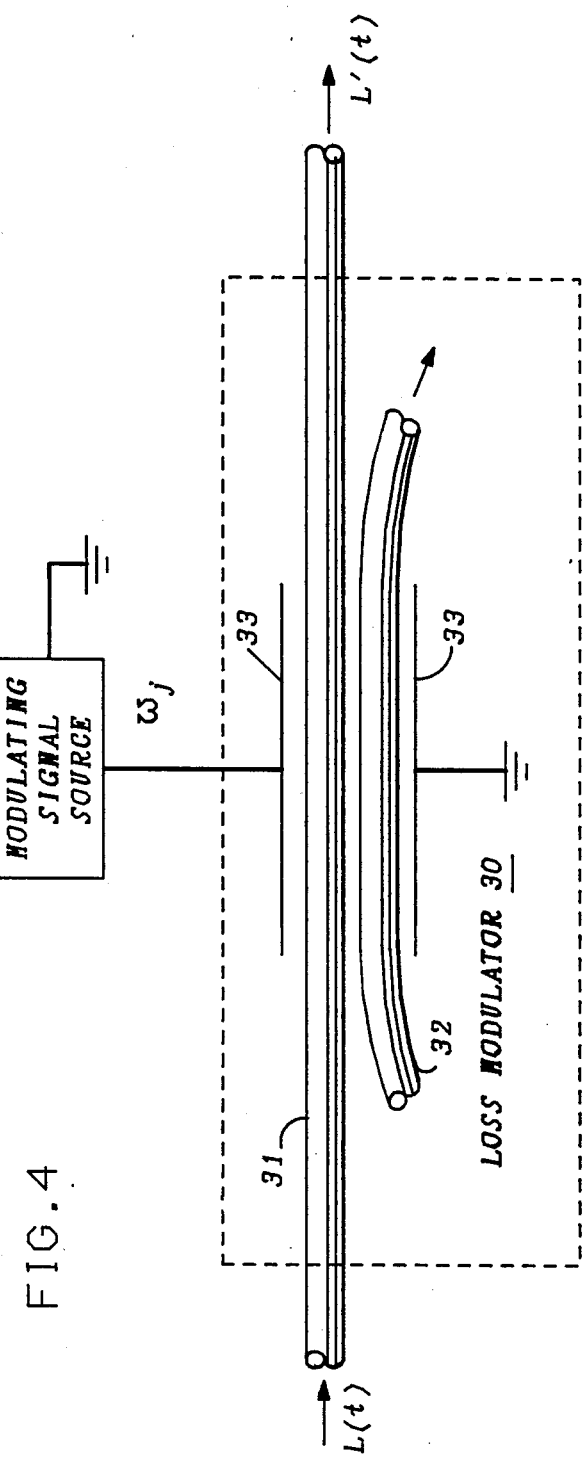

OPTICAL MIXER FOR UPCONVERTING OR DOWNCONVERTING AN OPTICAL SIGNAL

TECHNICAL FIELD

The present invention relates to an arrangement for directly mixing an optical subcarrier signal with a local oscillator signal using a gain-modulated optical amplifier or loss modulator.

DESCRIPTION OF THE PRIOR ART

Subcarrier multiplexing presents an attractive alternative to time-division (TDM) or wavelength-division multiplexing (WDP) in lightwave local distribution systems or local area networks (LANs). In subcarrier systems, data from each channel is used to modulate (ASK, PSK, or FSK) a microwave subcarrier which is then used to intensity modulate an optical carrier. At the receiver, a high-speed photodetector receives the sum of all transmitted subcarrier channels, and the desired channel is selected with a microwave bandpass filter or RF heterodyne receiver. More particularly, a conventional receiver would use the photodiode to regain the modulated subcarrier followed by electronic amplifiers, a filter and a demodulator. An advantage of a subcarrier system is that the receiver need only have the bandwidth of the desired channel and not the total system bandwidth, whereas receivers for TDM systems require enough bandwidth for the entire data throughput. This reduced bandwidth can lead to a significant increase in receiver sensitivity.

Optoelectronic mixers using GaAs photoconductive mixers have been used for the optoelectronic heterodyne detection of high-frequency intensity modulation signals. In this regard see, for example, the article "GaAs Optoelectronic Mixer Operation At 4.5 GHz" by D. K. W. Lam et al. in *IEEE Trans. On Electron Devices*, Vol. ED-31, No. 12, December 1984, at pages 1766–1768. There, the signal from a laser is received via an optical fiber and mixed with a local oxcillator signal in a GaAs photoconductive mixer to directly produce an electrical signal which is then processed with standard electronic equipment. The photoconductive mixer is an optoelectronic crosspoint switch of a a type that has been employed to construct switching matrices for very broad-band signals as shown, for example, in the article by R. I. MacDonald et al. in *IEEE Journal Of Solid-State Circuits*, Vol. SC-19, No. 2, April 1984, at pages 219–222.

In conventional receivers with high-frequency channels using photodetectors and then amplification and downconversion, as the frequency of the subcarrier signal gets higher, the sensitivity of the receiver is degraded because of noise in the photodetector-amplifier combination. The problem in the prior art is to provide an optical mixer which avoids the conventional conversion of an optical signal to an electrical signal in a photodetector and then the electrical amplification and downconversion of the converted electrical signal.

SUMMARY OF THE INVENTION

The foregoing problem in the prior art has been solved in accordance with the present invention which relates to an optical mixer using a gain-modulated optical amplifier or loss modulator. More particularly, for the present optical amplifier embodiment, a laser chip with or without the mirrors removed is used to receive an input signal lightwave signal. A D-C current which is modulated with a subcarrier signal is applied directly to the optical amplifier or loss modulator for directly producing an upconverted or downconverted lightwave output signal.

Other aspects of the present invention will become apparent during the course of the following description and by reference to the accompanying drawings.

BRIEF DESCRIPTION OF THE DRAWINGS

Referring now to the drawings in which like numerals represent like elements in the various views:

FIG. 4 is a diagram of an exemplary optical loss modulator for use in the receiver of FIG. 3.

DETAILED DESCRIPTION

Figure 1:
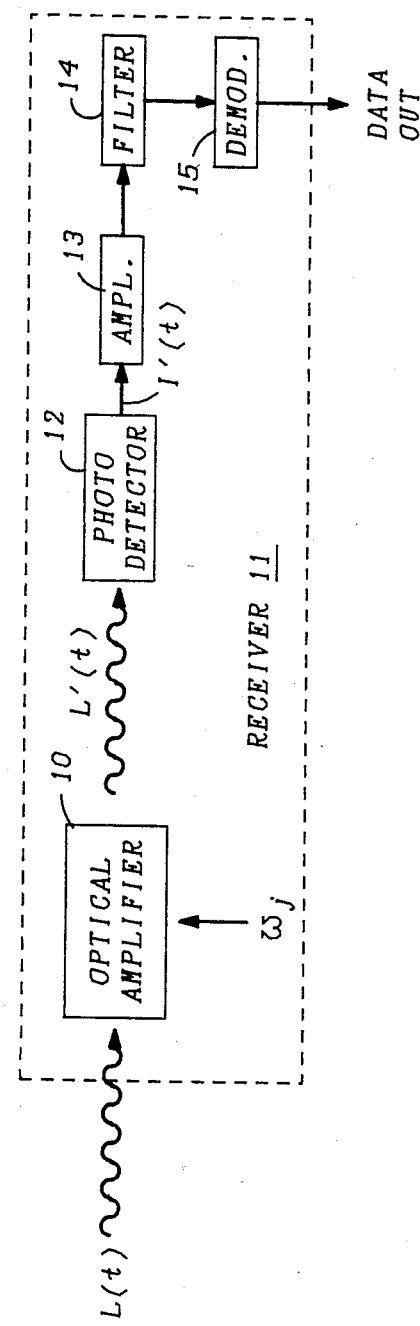
FIG. 1 is a block diagram of an optical amplifier upconverting or downconverting receiver in accordance with the present invention.

The present invention relates to an optical mixer using a gain-modulated optical amplifier or a loss modulator for either optically upconverting or downconverting an optical subcarrier signal in an optical transmission medium. As shown in FIG. 1, for the optical amplifier embodiment a subcarrier signal, which may be one of many multiplexed signals propagating along the transmission medium and denoted as L(t), is upconverted or downconverted in an optical amplifier 10 prior to being received in receiver 11. For purposes of explanation, and not for purposes of limitation, the input optical signal can comprise a Frequency Shift Keyed (FSK) or Phase Shift Keyed (PSK) multiplexed subcarrier signal which can be described by the equation $$L(t) = L_o + \sum_{i=1}^{N} L_i \cos(w_i t + \psi_i(t)) \quad (1)$$

where L(t) is the light intensity which consists of a D-C component $L_o$ and a sum of several (N) modulated carriers of frequency $\omega_i$. Information from each channel is encoded into $\psi_i(t)$ so that each channel occupies a narrow frequency channel from $\omega_i-(B/2)$ to $\omega_i+(B/2)$, where B is the channel bandwidth.

The upconversion or downconversion is accomplished by passing L(t) through an optical amplifier 10 which is being gain-modulated with a local oscillator signal $\omega_j$. The gain of optical amplifier 10 is given by A(t) where $$A(t) = A_o(1 + \alpha \cos \omega_j t), \quad (2)$$

where $\alpha$ is the ratio of the peak gain modulation to A.

For simplicity, only one subcarrier channel at frequency $\omega_i$ will be considered. L(t) can then be simplified to $$L(t) = L_o[1 + \beta \cos(\omega_i t + \psi(t))] \quad (3)$$

where $\beta$ is the ratio of the peak intensity modulation of $L_1$ to $L_o$. The output of the optical amplifier 10 is given by $$L'(t) = A_o L_o \{1 + \alpha \cos w_j t + \beta \cos(w_i t + \psi(t)) + \quad (4)$$

$$\tfrac{1}{2}\alpha\beta\cos[(w_i - w_j)t + \psi(t)] + \tfrac{1}{2}\alpha\beta\cos[(w_i + w_j)t + \psi(t)]\}.$$

Figure 3:
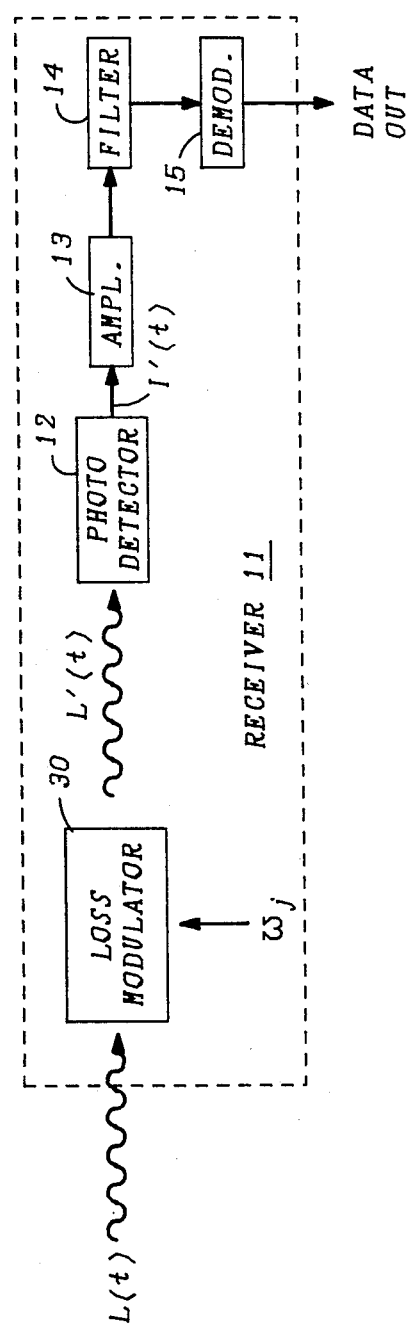
FIG. 3 is a block diagram of an upconverting or downconverting receiver including a loss modulator in accordance with the present invention.

The first term represents a DC light intensity, and the second and third terms represent the intensity modulation from the modulation of the gain, at $\omega_j$, and the input subcarrier signal, at frequency $\omega_i$, respectively. The final two terms are downconverted ($\omega_i - \omega_j$) and upconverted ($\omega_i + \omega_j$) subcarrier signals. The output signal L'(t) can be converted into a photocurrent using a photodetector 12 as shown in FIGS. 1 and 3 and the total photocurrent is given by $$I'(t) = R_o L'(t) L \quad (5)$$

where $R_o$ is the responsivity of the photodetector 12 in Amps/Watt.

The output from photodetector 12 can be amplified in an electronic amplifier 13 to provide the proper gain. A low pass filter 14 of, for example, bandwidth B eliminates all terms except those for the desired signal. A demodulator 15 can then recover the signal for transmission to the destined end user.

The advantages obtained with the present inventive arrangement of FIG. 1 is that optical amplifier 10 increases both the optical power and the receiver 11 sensitivity. Since the high-frequency subcarrier signals can be downconverted before detection, problems associated with coupling photodetectors to high-speed amplifiers are eliminated. Optical amplifier 10 and photodetector 12 can be monolithically fabricted thereby eliminating the alignment and packaging of individual components. The optical gain bandwidth of optical amplifiers is sufficiently large to eliminate problems associated with optical frequency changes from chip or temperature effects of the lasers. However, the gain bandwidth is small enough that optical wavelength division multiplexing (WDM) can still be used.

Figure 2:
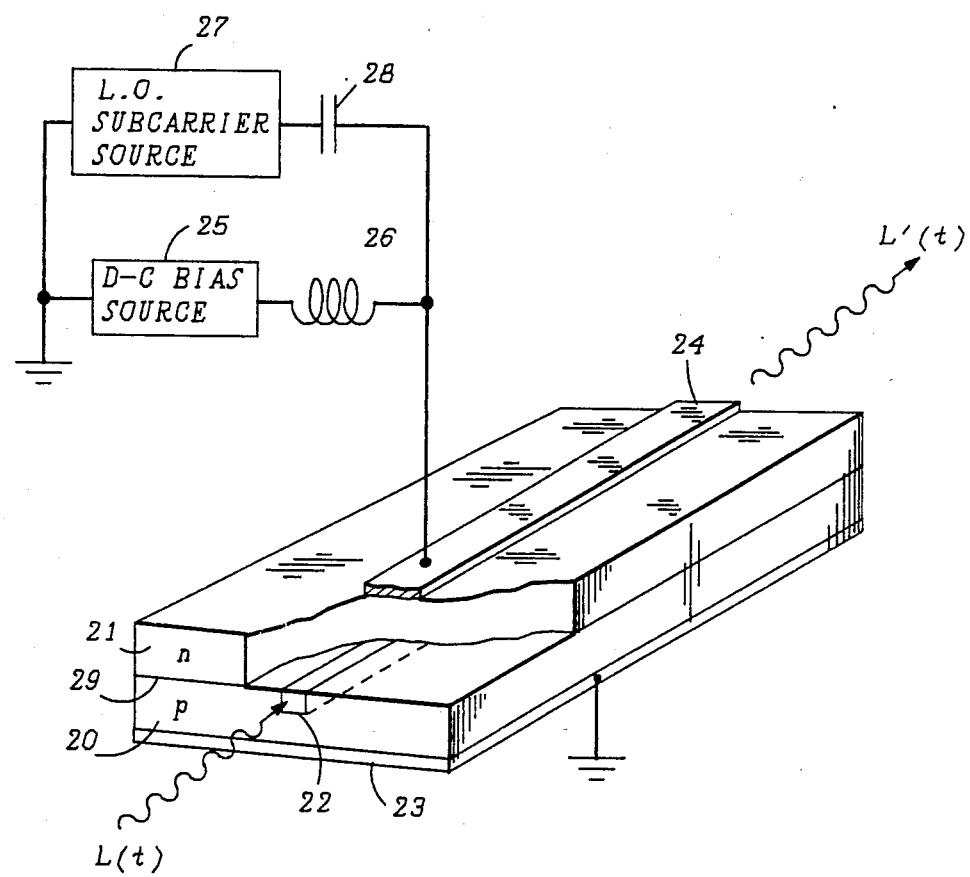
FIG. 2 is a view in perspective of a laser chip for practicing the optical amplifier of FIG. 1.

FIG. 2 is a view in section of an optical amplifier 10 chip which includes a p-layer 20 and an n-layer 21 disposed in contact with each other along a junction 29. As is well known for semi-conductor lasers, an active region channel 22 is formed in one of the layers 20 or 21 at the junction 29 of the two layers. A ground plane 23 is disposed on, for example, the major exposed area of the p-layer 20 while a conductive strip or plane 24 is formed on the major exposed area of the n-layer 21 above active region channel 22. The conductive strip 24 is connected to both a D-C bias source 25, via an inductor 26 to block any A-C components, and a Local Oscillator source 27, via a capacitor 28 to block any D-C components. Local oscillator subcarrier source 27 is tuned to generate the subcarrier $\cos \omega_j(t)$ which is used to gain modulate the optical signal L(t) arriving from a remote transmitter in accordance with the present invention.

FIG. 3 illustrates another embodiment of the present invention which replaces optical amplifier 10 of FIG. 1 with a loss modulator 30. It is to be understood that loss modulator 30 can comprise any suitable arrangement as, for example, an electro-optic intensity modulator as shown in FIG. 4 comprising a switching device including first and a second optical waveguiding means, 31 and 32, which are placed in proximity to each other over a predetermined length, and electrodes 33 adjacent the waveguiding means for causing the switching of portions of the incoming lightwave signal L(t) propagating in waveguiding means 31 into waveguiding means 32 in accordance with the amplitude of the electrical modulating signal placed across electrodes 33. More particularly, the two waveguiding means 31 and 32 can comprise, for example, lithium niobate waveguides, where waveguiding means 31 receives the input signal L(t) at a first end thereof and switches a predetermined portion of the input signal L(t) to waveguiding means 32 in accordance with the instantaneous amplitude of the electrical modulating signal $\omega_j$ impressed on electrodes 33 by a modulating signal source 34. The portion of the input signal switched to waveguiding means 32 is lost while the intensity of the output signal of modulator 30 comprises the mixed signals of L(t) and $\omega_j$. Therefore, the arrangement of FIGS. 1 and 2 provide an output signal from optical amplifier 10 which comprises the product of mixing L(t) with $\omega_j$ plus gain while the arrangement of FIGS. 3 and 4 provides an output signal from modulator 30 which is the same product of mixing the input and modulating signal plus some loss.

It is to be understood that the above-described embodiments are simply illustrative of the principles of the present invention. Various other modifications and changes may be made by those skilled in the art which will embody the principles of the invention and fall within the spirit and scope thereof. For example, amplifier 13 and filter 14 may be interchanged in the arrangement of FIG. 1 or that some other form of an optical amplifier can be used where a local oscillator directly gain modulates the received optical signal in the optical amplifier. It is to be understood that the arrangement shown in FIG. 2 is an exemplary arrangement for optical amplifier 10 including a known arrangement for a semiconductor laser formed from elements 20-24.

What is claimed is:

1. An optical mixer comprising:
    an optical modulator including an active channel region for receiving and propagating therealong a subcarrier modulated optical signal; and
    means for concurrently impressing a predetermined D-C bias signal and a predetermined local oscillator signal across the optical modulator for intensity modulating the received subcarrier optical signal to produce an upconverted or downconverted optical output signal.

2. An optical mixer according to claim 1 wherein the optical modulator is a laser amplifier including a semiconductor laser comprising:
    a p-layer and an n-layer of semiconductor material forming a junction therebetween including an active channel region in one of the layers, the active channel region extending between a first and a second edge of the junction; and
    a first and a second conductive layer disposed both on a surface of the p-layer and the n-layer, respectively, opposite the junction, and overlapping the active channel region, the first and second conductive layers being connected to the impressing means for impressing the D-C bias and predetermined subcarrier signals across the active channel region to gain modulate an optical signal propagating in the active channel region.

3. An optical mixer according to claim 1 wherein the optical modulator is a loss modulator comprising:
    first optical waveguiding means for receiving the subcarrier modulated optical signal at a first end thereof and propagating the subcarrier modulated optical signal towards a second end thereof;

second optical waveguiding means disposed adjacent the first optical waveguiding means for a predetermined length thereof; and the impressing means comprises at least one electrode disposed in proximity to the first and second waveguiding means, in the area where the two waveguiding means are adjacent each other, for causing a portion of the received subcarrier modulated optical signal propagating in the first optical waveguiding means to be switched into the second optical waveguiding means in accordance with the amplitude of the D-C bias signal and the predetermined subcarrier signal and produce the upconverted or downconverted optical output signal at the second end of the first optical waveguiding means.

4. An optical mixer according to claim 1, 2 or 3 wherein the subcarrier modulated signal received by the optical modulator comprises a plurality of subcarrier modulated signals disposed in separate frequency bands, and the predetermined local oscillator signal provided by the impressing means converts the frequency of a desired one of the plurality of subcarrier modulated signals to a predetermined frequency band.

5. An optical receiver comprising:
an optical modulator including an active channel region for receiving and propagating therealong a subcarrier modulated optical signal received at an input to the optical receiver;

means for concurrently impressing both a predetermined D-C bias signal and a predetermined local oscillator signal across the optical modulator for intensity modulating the received subcarrier optical signal to produce an upconverted or downconverted optical output signal at an output of the optical modulator; and a photodetector for converting the upconverted or downconverted optical output signal from the optical modulator into a corresponding electrical signal.

6. An optical receiver according to claim 5 wherein the optical modulator is a laser amplifier including a semiconductor laser comprising:

a p-layer and an n-layer of semiconductor material forming a junction therebetween including an active channel region in one of the layers, the active channel region extending between a first and a second edge of the junction; and a first and a second conductive layer disposed both (a) on a surface of the p-layer and the n-layer opposite the junction, respectively, and (b) overlapping the active channel region, the first and second conductive layers being connected to the impressing means for impressing the D-C bias and predetermined subcarrier signals across the active channel region to gain-modulate a subcarrier modulated optical signal received by the receiver and propagating in the active channel region.

7. An optical receiver according to claim 5 wherein the optical modulator is a loss modulator comprising:

first optical waveguiding means for receiving the subcarrier modulated optical signal at a first end thereof and propagating the subcarrier modulated optical signal towards a second end thereof; and second optical waveguiding means disposed adjacent the first optical waveguiding means for a predetermined length thereof; and the impressing means comprises at least one electrode disposed in proximity to the first and second waveguiding means, in the area where the two waveguiding means are adjacent each other, for causing a portion of the received subcarrier modulated optical signal propagating in the first optical waveguiding means to be switched into the second optical waveguiding means in accordance with the amplitude of the D-C bias signal and the predetermined subcarrier signal and produce the upconverted or downconverted optical output signal at the second end of the first optical waveguiding means.

8. An optical receiver according to claim 5, 6 or 7 wherein the subcarrier modulated optical signal received at the input to the optical receiver comprises a plurality of subcarrier modulated signals disposed in separate frequency bands, the optical receiver further comprising:

means for filtering the output signal from the photodetector for passing only a predetermined frequency band comprising an output signal including a desired one of from the plurality of amplified-downconverted received subcarrier modulated signals.

* * * * *